(12) United States Patent
Himpe (10) Patent No.: US 8,624,631 B2
(45) Date of Patent: *Jan. 7, 2014

(54) PROGRAMMABLE PULSE WIDTH DISCRIMINATOR

(71) Applicant: STMicroelectronics, Inc., Coppell, TX (US)

(72) Inventor: Vincent Himpe, San Jose, CA (US)

(73) Assignee: STMicroelectronics, Inc., Coppell, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/782,498

(22) Filed: Mar. 1, 2013

(65) Prior Publication Data

US 2013/0176057 A1    Jul. 11, 2013

Related U.S. Application Data

(63) Continuation of application No. 12/980,834, filed on Dec. 29, 2010, now Pat. No. 8,410,819.

(51) Int. Cl.
   *G01R 29/02* (2006.01)

(52) U.S. Cl.
   USPC ............................................. 327/33; 327/37

(58) Field of Classification Search
   None
   See application file for complete search history.

(56) References Cited

U.S. PATENT DOCUMENTS

| | | |
|---|---|---|
| 5,815,690 A | 9/1998 | Kowert et al. |
| 7,017,069 B2 | 3/2006 | Kudo et al. |
| 7,362,152 B2 | 4/2008 | Figoli |
| 7,714,626 B2 | 5/2010 | Kris |
| 8,410,819 B2 * | 4/2013 | Himpe ............................ 327/33 |

* cited by examiner

*Primary Examiner* — Cassandra Cox
(74) *Attorney, Agent, or Firm* — Gardere Wynne Sewell LLP (57) ABSTRACT

Disclosed is a programmable pulse width discriminator circuit operable to receive a set of parameters from a user and indicate when an input signal satisfies conditions set by the user-defined parameters. The input signal is sampled by the pulse width discriminator circuit to detect a desired state of the input signal. The user may set the parameters such that the pulse width discriminator indicates the condition wherein the number of consecutive samples for which the input signal is the desired state is (i) greater than a first threshold value, (ii) less than a second threshold value, or (iii) between the first and second threshold values. In these embodiments, the user sets the first and second threshold values and selects which set of conditions are indicated by the output of the circuit.

21 Claims, 7 Drawing Sheets

PROGRAMMABLE PULSE WIDTH DISCRIMINATOR

PRIORITY CLAIM

This application is a continuation of U.S. application for patent Ser. No. 12/980,834 filed Dec. 29, 2010, the disclosure of which is incorporated by reference.

TECHNICAL FIELD

The present invention relates generally to integrated circuits designed to detect an input signal and, more specifically, to an integrated circuit having programmable criteria for receiving an input signal and determining whether the amount of time that the input signal is high is less than a value, longer than a value, or within a range of values.

BACKGROUND

A pulse width discriminator circuit measures the pulse width of an incoming signal and determines whether or not the pulse width is within an acceptable range. Conventional pulse width discriminator circuitry depends on monostable circuits often using R-C time constants which require analog components that are difficult to integrate within the conventional pulse width discriminator circuits. Such monostable circuitry provides limited functionality and has a narrow range of applicability. Therefore, there exists a need for a pulse width discriminator circuit that provides a more flexible approach that is fully operable in the digital domain.

SUMMARY

The present disclosure provides a programmable pulse width discriminator circuit operable to receive a set of parameters from a user and indicate when a received input signal satisfies conditions set by the user-defined parameters. The input signal is sampled by the pulse width discriminator circuit to detect a desired state of the input signal. In one embodiment, the user can set the parameters such that the pulse width discriminator circuit indicates the condition wherein the number of consecutive samples for which the input signal is the desired state is greater than a first threshold value. In another embodiment, the user can set the parameters such that the pulse width discriminator circuit indicates the condition wherein the number of consecutive samples for which the input signal is the desired state is less than a second threshold value. In yet another embodiment, the user can set the parameters such that the pulse width discriminator circuit indicates the condition wherein the number of consecutive samples for which the input signal is the desired state is between the first threshold value and the second threshold value. In the aforementioned embodiments, the user sets the first and second threshold values and determines which set of conditions will be indicated by the output of the pulse width discriminator circuit.

In an embodiment, a pulse width discriminator circuit comprises: a first circuit configured to receive a pulsing logic signal and count a value indicative of a number of clock cycles that said pulsing logic signal has a first logic state; and a second circuit configured to compare said counted value to a threshold and generate an output signal when said value satisfies said threshold.

In an embodiment, a method comprises: receiving a pulsing logic signal; incrementing a counter value when said pulsing logic signal has a first logic state; resetting said counter value when said pulsing logic signal has a second logic state; comparing said counter value to a threshold; and generating an output signal when said value satisfies said threshold.

The foregoing and other features and advantages of the present disclosure will become further apparent from the following detailed description of the embodiments, read in conjunction with the accompanying drawings. The detailed description and drawings are merely illustrative of the disclosure, rather than limiting the scope of the invention as defined by the appended claims and equivalents thereof.

BRIEF DESCRIPTION OF THE DRAWINGS

Embodiments are illustrated by way of example in the accompanying figures, in which like reference numbers indicate similar parts, and in which.

DETAILED DESCRIPTION OF THE DRAWINGS

The present disclosure provides a programmable pulse width discriminator circuit operable to receive a set of parameters from a user and indicate when a received input signal satisfies conditions set by the user-defined parameters. The input signal is sampled by the pulse width discriminator circuit to detect a desired state of the input signal. In one embodiment, the user can set the parameters such that the pulse width discriminator circuit indicates the condition wherein the number of consecutive samples for which the input signal is the desired state is greater than a first threshold value. In another embodiment, the user can set the parameters such that the pulse width discriminator circuit indicates the condition wherein the number of consecutive samples for which the input signal is the desired state is less than a second threshold value. In yet another embodiment, the user can set the parameters such that the pulse width discriminator circuit indicates the condition wherein the number of consecutive samples for which the input signal is the desired state is between the first threshold value and the second threshold value.

Figure 1:
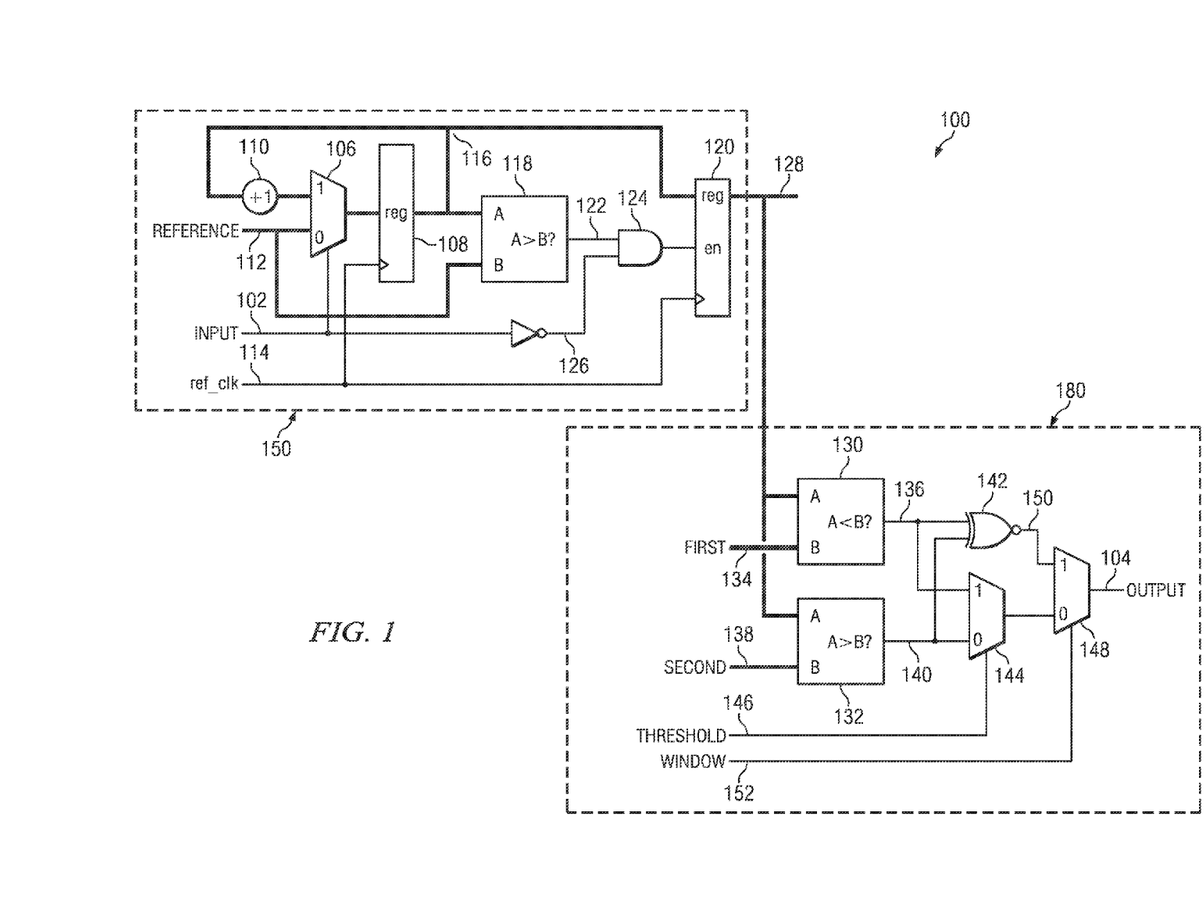
FIG. 1 illustrates a circuit diagram representing an example embodiment of the disclosed pulse width discriminator circuit.

FIG. 1 illustrates an example embodiment of a pulse width discriminator circuit 100 in accordance with the present disclosure, wherein the desired state of the input signal is logic high. The pulse width discriminator circuit 100 samples a received input signal 102, counts the number of consecutive samples for which the input signal 102 is the desired state (i.e., logic high), and produces an output signal 104 indicating whether or not the number of consecutive samples for which the input signal 102 is high satisfies a set of conditions defined by the user. It should be appreciated by those skilled in the art that although the disclosed pulse width discriminator circuit 100 illustrated in FIG. 1 is designed to count the number of consecutive samples for which the input signal is logic high, in other embodiments, the disclosed pulse width discriminator circuit may be designed to count the number of consecutive samples for which the input signal is logic low. As such, it should be understood that the subsequent disclosure is also applicable to such other embodiments.

Figure 2:
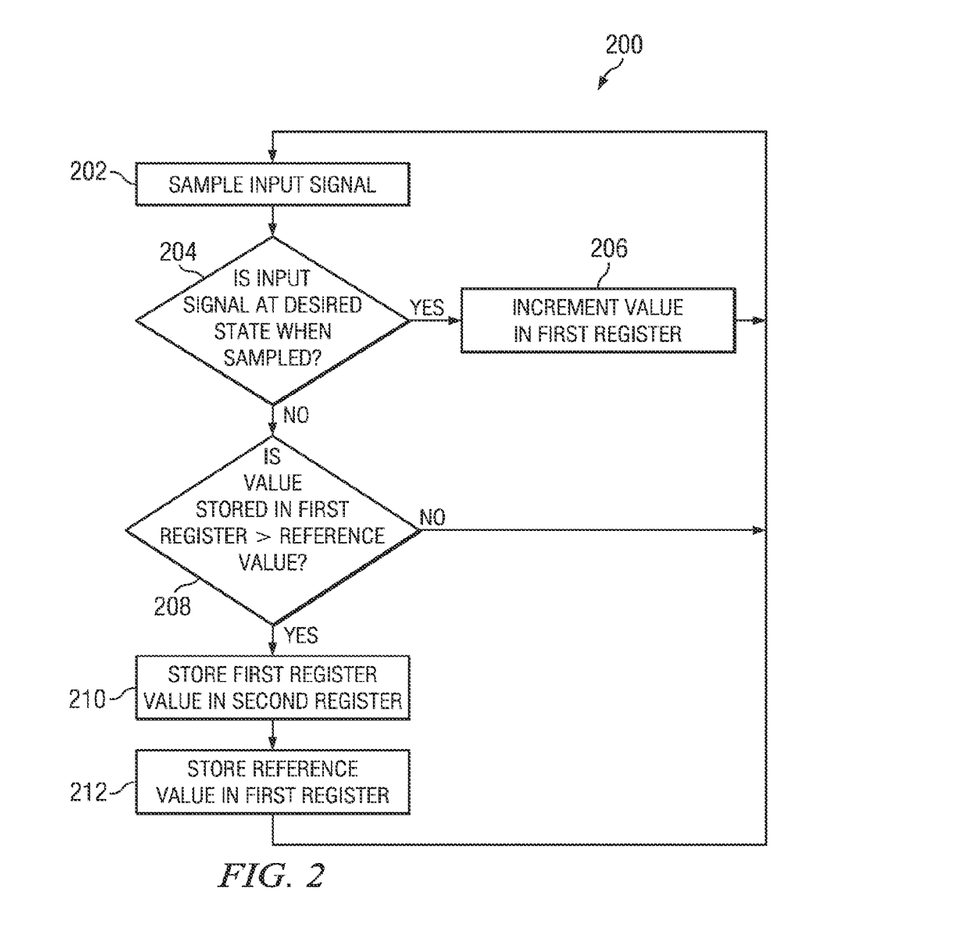
FIG. 2 illustrates a flowchart generally describing operation of a first portion of the pulse width discriminator circuit illustrated in FIG. 1.

For purposes of explaining operation of the disclosed pulse width discriminator, the circuit 100 illustrated in FIG. 1 is divided into two sections. The first section 150 is primarily designed to measure the pulse width of the sampled input signal 102 (i.e., count the number of consecutive samples for which the input signal is the desired state), and is explained in conjunction with the flowchart 200 illustrated in FIG. 2. The second section 180 is primarily designed to interpret the pulse width measured by the first section 150 in accordance with the parameters provided by the user to indicate whether the measured pulse width satisfies the conditions dictated by the user-defined parameters. The second section 180 is explained in conjunction with the flowchart 300 illustrated in FIG. 3.

In accordance with the example embodiment provided by the circuit 100 illustrated in FIG. 1, an input signal 102 is coupled to the control input of a multibit input multiplexer 106. The input multiplexer 106 is coupled to a first register 108 through a multibit bus and, responsive to the input signal 102, loads a value into the first register 108. In this particular example embodiment, the desired state of the input signal 102 is logic high. Therefore, when the input signal 102 is logic high, the input multiplexer 106 loads an incrementation 110 of the value stored in the first register 108; and when the input signal 102 is logic low, the input multiplexer 106 loads a reference value 112 into the register 108. In the example embodiment described herein, the reference value 112 is zero, but it should be understood that the reference value 112 may be any value determined by the user.

The first register 108 illustrated in FIG. 1 is controlled by a clock signal 114, wherein the clock signal 114 sets the time scale for sampling the input signal 102. For example, if the desired sampling interval, or resolution, is 1 us, then the clock signal 114 is set to 1 MHz. When activated by the clock signal 114, the register 108 stores the multibit value received from the input multiplexer 106 and presents this value on a data bus 116. Thus, the input signal 102 is sampled on the clock signal 114, wherein for each sample for which the input signal 102 is logic high, the value stored in the register 108 is incremented, and for each sample for which the input signal 102 is logic low, the reference value 112 is stored in the register 108. In essence, the first register 108 counts the number of consecutive samples of the input signal 102 for which the input signal 102 is the desired state (i.e., high), thereby measuring the pulse width of the sampled input signal 102. When the sampled input signal 102 is not the desired state, the value in the register 108 is reset to the reference value 112.

The first register 108 may have any value preloaded into it upon reset (i.e., clock cycle 0) of the circuit 100. When the value preloaded in the first register 108 is zero, the value in the register 108 represents the number of consecutive samples for which the input signal 102 is the desired state. When the value preloaded in the first register 108 is greater than zero, the number of consecutive samples for which the input signal 102 is the desired state is the difference between the value currently stored in the first register 108 and the preloaded register value. Similarly, when the reference value 112 loaded into the first register 108 is greater than zero, the number of consecutive samples for which the input signal 102 is the desired state (i.e., the measured pulse width) is the difference between the value currently stored in the first register 108 and the reference value 112. This may be beneficial to the user because the user may effectively shift the pulse width comparison window or range, as described in greater detail below, without changing the first and second threshold values simply by adjusting the reference value 112 loaded in the register 108.

As illustrated in FIG. 1, the data bus 116 is connected to a first comparator 118, a second register 120, and is also fed back to the high input of the input multiplexer 106 where it is incremented to provide the aforementioned incremented first register value 110. It should be appreciated that in embodiments wherein the desired sampled input signal state is logic low, the data bus 116 would be fed back to the low input of the input multiplexer 106, and the reference value 112 would be connected to the high input of the input multiplexer 106. The first comparator 118 receives both the reference value 112 and the value stored in the register 108 (from the data bus 116). The first comparator 118 compares the two values and produces a first comparator output signal 122. When the value stored in the register 108 is greater than the reference value 112, first comparator output signal 122 is logic high; otherwise, the first comparator output signal 122 is logic low. The first comparator output signal 122 is received at an AND gate 124 along with an inverted state 126 of the input signal 102. When the input signal 102 goes low and the value stored in the register 108 is greater than the reference value 112, the output of the AND gate 124 goes high, which sets the enable bit of the second register 120. When the enable bit is set, the second register 120 stores the value received from the data bus 116 at the next clock cycle. Thus, when activated by the clock signal 114, the second register 120 stores the value that was stored in the register 108 at the previous clock cycle.

The foregoing disclosure provides a detailed description of the operation of the first section 150 of the pulse width discriminator circuit 100 illustrated in FIG. 1. A more general description of the operation of the first section 150 of the circuit 100 is provided by the flowchart 200 illustrated in FIG. 2. At step 202, the input signal 102 is sampled, and step 204 determines whether or not the sampled input signal 102 is the desired state (i.e., logic high). If the input signal 102 is sampled at the desired state, then the value stored in the first register 108 is incremented in step 206. If the input signal 102 is not sampled at the desired state, the value stored in the first register 108 is compared to the reference value 112 in step 208. If the value stored in the first register 108 is greater than the reference value 112, then the value stored in the first register 108 is then stored in the second register 120 in step 210, and then the reference value 112 is stored in the first register 108 in step 212. It should be understood that the comparison occurring in step 208 happens regardless of whether or not the input signal 102 is sampled at the desired state. However, if the input signal 102 is sampled at the desired state, then the result of the comparison occurring in step 208 is irrelevant because the AND gate 124 is not set. Therefore, this comparison is not illustrated in the flowchart 200 in FIG. 2 when the input signal 102 is sampled at the desired state.

Referring again to FIG. 1, the value stored in the second register 120 is the measured pulse width of the sampled input signal 102, and is output on a multibit bus as the measured pulse width 128. The measured pulse width 128 is then analyzed by the circuitry included in the second section 180 of the pulse width discriminator circuit 100. As illustrated in FIG. 1, the measured pulse width 128 is received at a first threshold comparator 130 and a second threshold comparator 132, wherein the inputs to the first threshold comparator 130 and the second threshold comparator 132 are received on multibit buses. In addition to the measured pulse width 128, the first threshold comparator 130 receives a first threshold value 134. The first threshold value 134 is a user-programmable input (also referred to herein as a parameter) that is compared to the measured pulse width 128 to determine whether or not the measured pulse width 128 satisfies a set of conditions indicated by the parameters set by the user (e.g., whether the measured pulse width 128 is less than the first threshold value 134). Thus, the first threshold comparator 130 compares the measured pulse width 128 to the first threshold value 134, and produces a high first threshold comparator output signal 136 when the measured pulse width 128 is less than the first threshold value 134; otherwise, the first threshold comparator 130 produces a low first threshold comparator output signal 136. Accordingly, the first threshold comparator output signal 136 indicates whether or not the measured pulse width 128 is less than the first threshold value 134.

The second threshold comparator 132 receives both the measured pulse width 128 and a second threshold value 138. The second threshold value 138 is a user-programmable input that is compared to the measured pulse width 128 to determine whether or not the measured pulse width 128 satisfies a set of conditions indicated by the parameters set by the user (e.g., whether the measured pulse width 128 is greater than the second threshold value 138). Thus, the second threshold comparator 132 compares the measured pulse width 128 to the second threshold value 138, and produces a high second threshold comparator output signal 140 when the measured pulse width 128 is greater than the second threshold value 138; otherwise, the second threshold comparator 132 produces a low second threshold comparator output signal 140. Accordingly, the second threshold comparator output signal 140 indicates whether or not the measured pulse width 128 is greater than the second threshold value 138.

The first threshold comparator output signal 136 and second threshold comparator output signal 140 are received as inputs at both an XNOR gate 142 and a threshold multiplexer 144. The threshold multiplexer 144 is controlled by a threshold input signal 146, wherein the value of the threshold input signal 146 is a user-programmable input. When the threshold input signal 146 is logic high, the threshold multiplexer 144 couples the first threshold comparator output signal 136 to a low input of a window multiplexer 148. When the threshold input signal 146 is logic low, the threshold multiplexer 144 couples the second threshold comparator output signal 140 to the low input of the window multiplexer 148. Thus, when the threshold input signal 146 is logic high, the threshold multiplexer 144 selects the first threshold comparator output signal 136 as its output, wherein this output would indicate whether or not the measured pulse width 128 is less than the first threshold value 134. When the threshold input signal 146 is logic low, the threshold multiplexer 144 selects the second threshold comparator output signal 140 as its output, wherein this output would indicate whether or not the measured pulse width 128 is greater than the second threshold value 138.

The XNOR gate 142 is coupled to the high input of the window multiplexer 148 and produces a high XNOR gate signal 150 when the first threshold comparator output signal 136 and second threshold comparator output signal 140 are the same. If the first threshold comparator output signal 136 and second threshold comparator output signal 140 are different, the XNOR gate 142 produces a low XNOR gate signal 150. The XNOR gate 142 is intended to produce a high XNOR gate signal 150 when the measured pulse width 128 is within a range defined by the first threshold value 134 and the second threshold value 138. The foregoing description appears to suggest that the measured pulse width 128 must be less than the first threshold value 134 and greater than the second threshold value 138 (i.e., both the first threshold comparator output signal 136 and second threshold comparator output signal 140 are high) for the output of the XNOR gate 142 to be true. However, due to the logic of an XNOR gate, the XNOR gate 142 also produces a high XNOR gate signal 150 if the first threshold comparator output signal 136 and second threshold comparator output signal 140 are low. However, for this condition to be true, the second threshold value 138 would have to be a value greater than or equal to the first threshold value 134. Therefore, regardless of whether the first threshold value 134 is less than, greater than, or equal to the second threshold value 138, the XNOR gate 142 will still produce a high XNOR gate signal 150 when the measured pulse width 128 falls within the range (window) defined by the first threshold value 134 and the second threshold value 138. As such, the XNOR gate signal 150 indicates whether or not the measured pulse width 128 is within the range defined by the first threshold value 134 and the second threshold value 138. It should be appreciated by those skilled in the art that, in an alternate embodiment, an AND gate may be used in place of the XNOR gate 150 illustrated in FIG. 1 provided that the first threshold value 134 is always greater than the second threshold value 138.

The window multiplexer 148 is controlled by a user-programmable window input signal 152 and, based on the window input signal 152, selects one of its inputs as the output signal 104 of the pulse width discriminator circuit 100. Thus, when the window input signal 152 is logic high, the XNOR gate signal 150 is selected by the window multiplexer 148 as the pulse width discriminator output signal 104. When the window input signal 152 is logic low, the signal selected by the threshold multiplexer 144 is selected by the window multiplexer 148 as the pulse width discriminator output signal 104.

In accordance with the present disclosure, the user inputs a set of runtime parameters to the pulse width discriminator circuit 100, wherein the parameters include at least the following: (i) the first threshold value 134, (ii) the second threshold value 138, (iii) the threshold input signal 146, and (iv) the window input signal 152. It should be understood that the parameters mentioned above are provided by the user to control operation of the pulse width discriminator circuit, and as such, how the pulse width discriminator output signal 104 should be interpreted. However, the user may also provide other data used to control the operation of the pulse width discriminator. Such other data may include, but is not limited to, the reference value 112, a value stored (i.e., preloaded) in the first register 108 at clock cycle 0, and a value stored in the second register 120 at clock cycle 0.

In summary, when the user inputs a logic high window input signal 152, the pulse width discriminator circuit 100 is programmed to output a high output signal 104 when the measured pulse width 128 is within the range, or window, defined by the first threshold value 134 and the second threshold value 138. When the user inputs a logic low window input signal 152 and a logic low threshold input signal 146, the pulse width discriminator circuit 100 is programmed to output a high output signal 104 when the measured pulse width 128 is greater than the second threshold value 138. When the user inputs a logic low window input signal 152 and a logic high threshold input signal 146, the pulse width discriminator circuit 100 is programmed to output a high output signal 104 when the measured pulse width 128 is less than the first threshold value 134. Accordingly, by setting these parameters (i.e., the threshold input signal 146 and window input signal 152), the user is controlling the condition that is indicated by the output signal 104 of the pulse width discriminator circuit 100, and thus, how the pulse width discriminator circuit output signal 104 should be interpreted.

Figure 3:
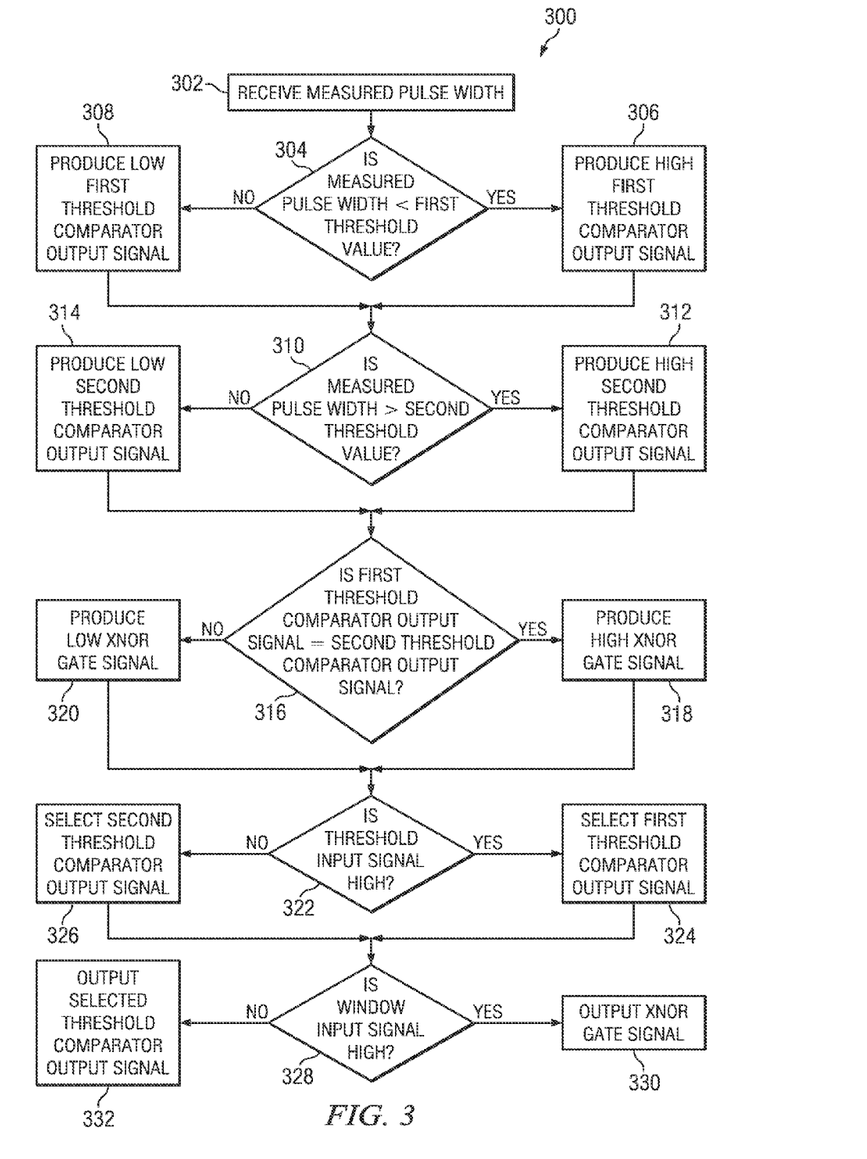
FIG. 3 illustrates a flowchart generally describing operation of a second portion of the pulse width discriminator circuit illustrated in FIG. 1.

The foregoing disclosure provides a detailed description of the operation of the second section 180 of the pulse width discriminator circuit 100 illustrated in FIG. 1. A more general description of the operation of the second section 180 of the circuit 100 is provided by the flowchart 300 illustrated in FIG. 3. As shown in FIG. 3, the measured pulse width 128 is received in step 302, and is compared to the first threshold value 134 in step 304. If the measured pulse width 128 is less than the first threshold value 134, then the first threshold comparator 130 produces a high first threshold comparator output signal 136 in step 306. Otherwise, the first threshold comparator 130 produces a low first threshold comparator output signal 136 in step 308. In step 310, the measured pulse width 128 is compared to the second threshold value 138. If the measured pulse width 128 is greater than the second threshold value 138, then the second threshold comparator 132 produces a high second threshold comparator output signal 140 in step 312. Otherwise, the second threshold comparator 132 produces a low second threshold comparator output signal 140 in step 314. In step 316, first threshold comparator output signal 136 is compared to the second threshold comparator output signal 140. If the first threshold comparator output signal 136 is equal to the second threshold comparator output signal 140, then the XNOR gate 142 produces a high XNOR gate signal 150 in step 318. Otherwise, the XNOR gate 142 produces a low XNOR gate signal 150 in step 320. In the example embodiments described herein, the parameters provided by the user are set before operation of the pulse width discriminator circuit 100 begins. However, it should be appreciated by those skilled in the art that the user-defined parameters may be changed during operation of the pulse width discriminator without departing from the scope of the present disclosure.

Step 322 checks if the threshold input signal 146 is high. If the threshold input signal 146 is high, then the threshold multiplexer 144 selects the first threshold comparator output signal 136 as its output in step 324. If the threshold input signal 146 is low, then the threshold multiplexer 144 selects the second threshold comparator output signal 140 as its output is step 326. Step 328 checks if the window input signal 152 is high. If the window input signal 152 is high, then the window multiplexer 148 selects the XNOR gate signal 150 as its output in step 330, and thus, the pulse width discriminator output signal 104 indicates whether or not the measured pulse width 128 is within the range defined by the first and second threshold values 134 and 138. If the window input signal 152 is low, then, in step 332, the window multiplexer 148 selects as its output the threshold comparator output signal selected by the threshold multiplexer 144. If the threshold multiplexer 144 selected the first threshold comparator output signal 136 as its output in step 324, then the pulse width discriminator output signal 104 indicates whether or not the measured pulse width 128 is less than the first threshold value 134. If the threshold multiplexer 144 selected the second threshold comparator output signal 140 as its output in step 326, then the pulse width discriminator output signal 104 indicates whether or not the measured pulse width 128 is greater than the second threshold value 138.

Figure 4A:
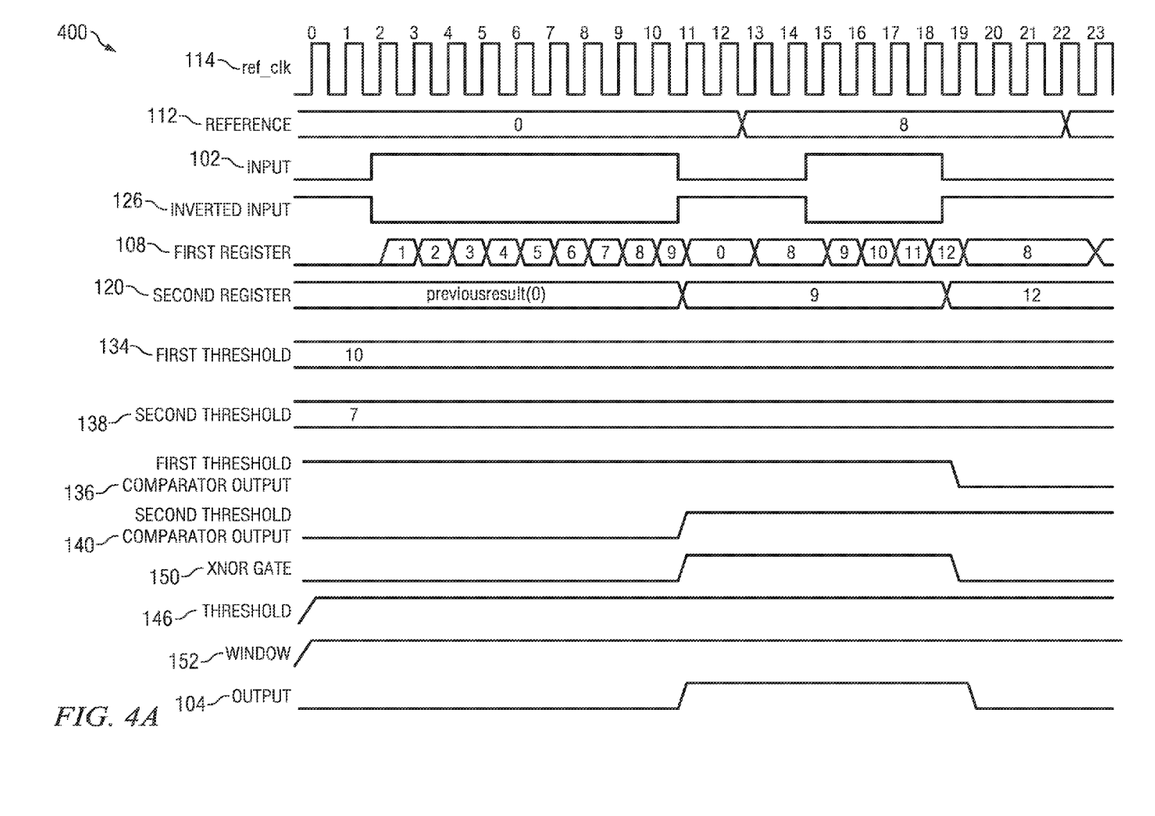
FIGS. 4A, 4B, and 4C illustrate waveform drawings of example embodiments of the pulse width discriminator circuit illustrated in FIG. 1.
Figure 4B:
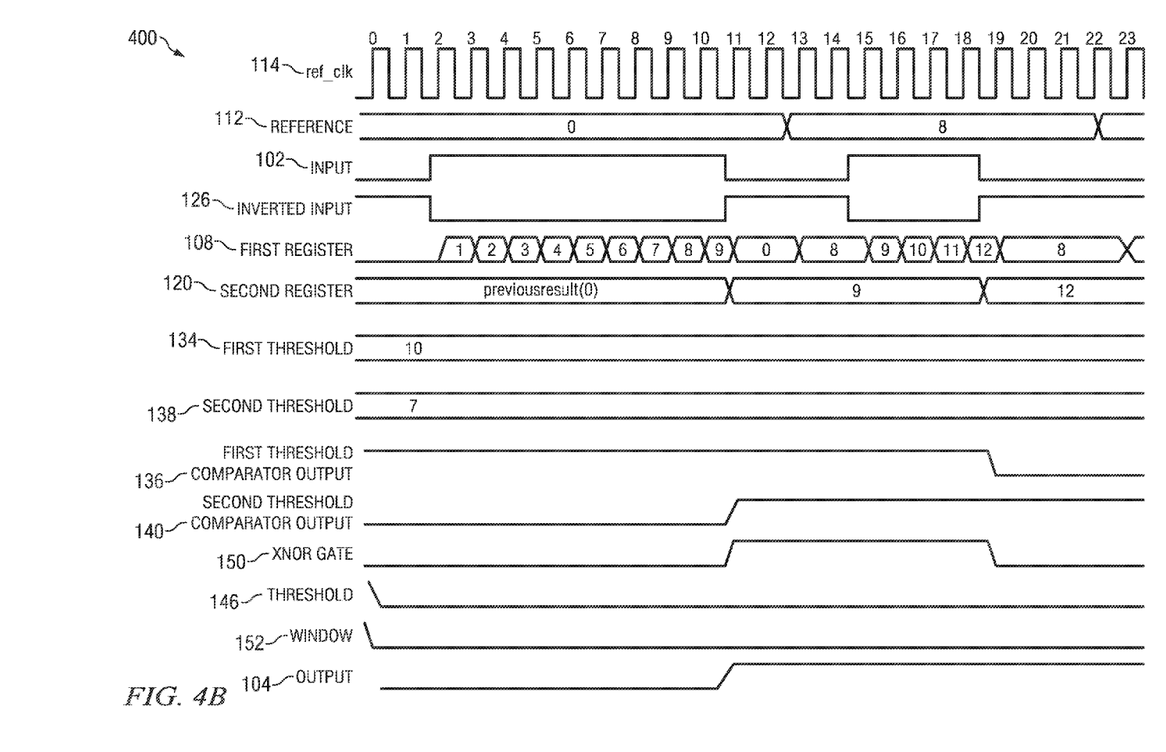
Figure 4C:
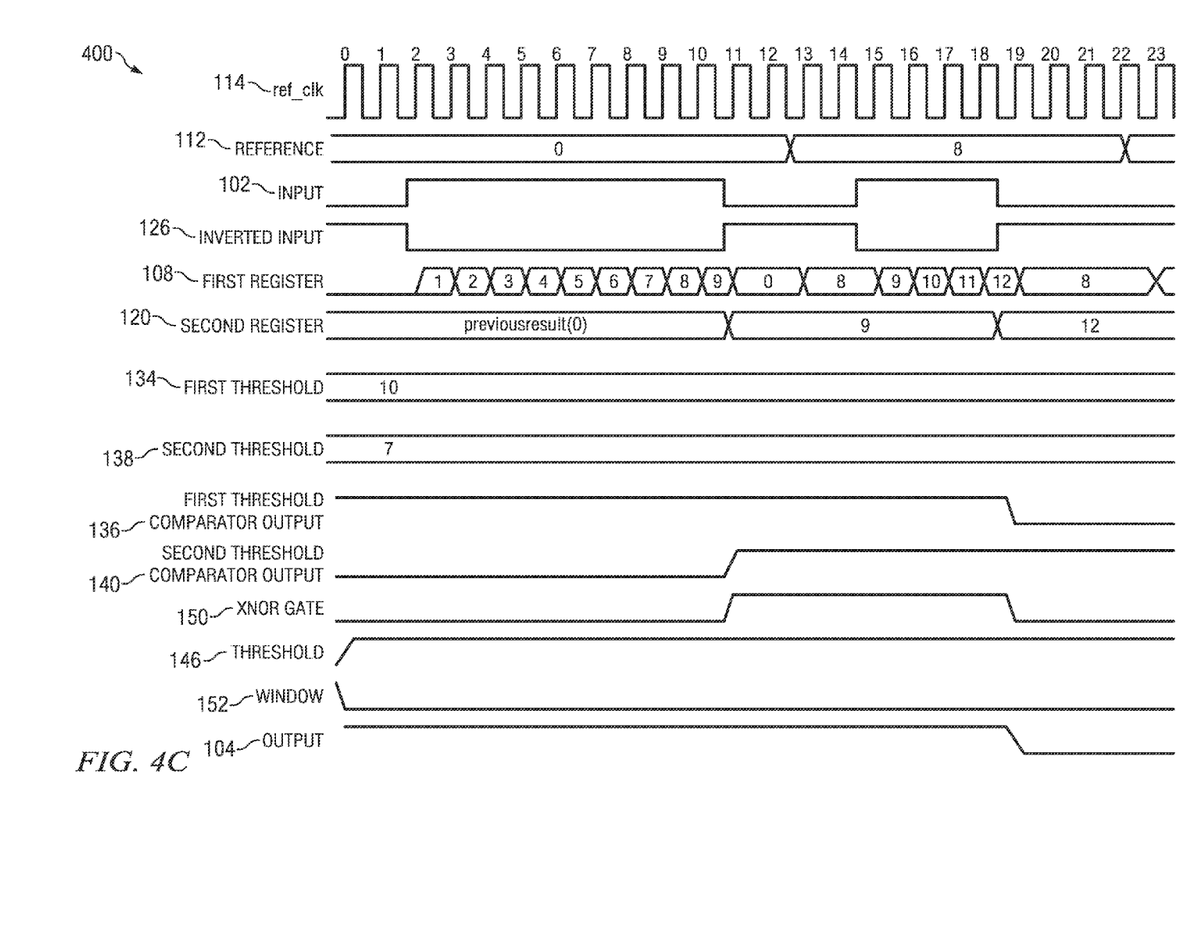

Reference is now made to FIGS. 4A, 4B, and 4C for purposes of discussing example implementations further illustrating the operation of the disclosed pulse width discriminator circuit 100 illustrated in FIG. 1 as discussed above. FIGS. 4A, 4B, and 4C each illustrate a waveform drawing 400 of an example input signal 102, clock signal 114, first threshold comparator output signal 136, second threshold comparator output signal 140, XNOR gate signal 150, threshold input signal 146, window input signal 152, and the corresponding pulse width discriminator output signal 104. Additionally, FIGS. 4A, 4B, and 4C each illustrate the reference value 112, the value stored in the first register 108, the value stored in the second register 120 (measured pulse width 128), the first threshold value 134, and the second threshold value 138. For FIGS. 4A, 4B, and 4C, the reference value 112 is zero, the first threshold value 134 is set to ten, and the second threshold value 138 is set to seven. Additionally, both the first register 108 and the second register 120 are presumed to be preloaded with a value of zero upon reset (i.e., clock cycle 0). As such, the first threshold comparator output signal 136 is set to high at clock cycle 0, the second threshold comparator output signal 140 is set to low, and the XNOR gate signal 150 is also set to low.

As illustrated in the waveforms 400 of FIGS. 4A, 4B, and 4C, the input signal 102 is sampled at a logic low state for clock cycles 0 and 1 before being sampled at a logic high state at clock cycle 2. Since the logic high state is the desired state of the input signal 102, the first register 108 begins counting the number of consecutive samples for which the input signal 102 is logic high. The input signal 102 remains high for nine consecutive samples. As such, the first register 108 reaches a value of nine before the input signal 102 goes low between clock cycles 10 and 11. At clock cycle 10, the value in the first register 108 is greater than the reference value 112 (zero). Therefore, when the input signal 102 goes low, the inverted input signal 126 goes high causing the AND gate 124 to set the enable bit of the second register 120. At the next clock cycle (clock cycle 11), the value stored in the first register 108 is stored in the second register before reference value 112 is stored in the first register 108. Thus, the value in the first register 108 is reset to zero (the reference value 112) at clock cycle 11.

The measured pulse width 128 is now set to nine at clock cycle 11. Therefore, the first threshold comparator 130 compares the measured pulse width 128 to the first threshold value 134 (ten). The first threshold value 134 is greater than the measured pulse width 128, so the first threshold comparator output signal 136 remains high. Additionally, the second threshold comparator 132 compares the measured pulse width 128 to the second threshold value 138 (seven). The second threshold value 138 is less than the measured pulse width 128, so the second threshold comparator output signal 140 goes high at clock cycle 11. Since both the first threshold comparator output signal 136 and the second threshold comparator output signal 140 are high, the XNOR gate signal 150 goes high at clock cycle 11.

Between clock cycles 12 and 13 the reference value 112 is changed to eight. Therefore, when the low input signal 102 is sampled at clock cycle 13, the reference value 112 is loaded into the first register 108. At clock cycle 15, the input signal 102 is sampled at a high state, and the first register 108 begins counting, starting at the reference value 112, eight. Since the input signal 102 is sampled at a high state for four consecutive samples, the value stored in the first register 108 reaches twelve at clock cycle 18. The input signal 102 goes low again between clock cycles 18 and 19, so the first register value (twelve) is stored in the second register 120 at clock cycle 19 before the first register 108 is reset to the reference value 112, eight.

The measured pulse width 128 is now set to twelve at clock cycle 19. Therefore, the first threshold comparator 130 compares the measured pulse width 128 to the first threshold value 134. The first threshold value 134 is less than the measured pulse width 128, so the first threshold comparator output signal 136 goes low at clock cycle 19. Additionally, the second threshold comparator 132 compares the measured pulse width 128 to the second threshold value 138. The second threshold value 138 is less than the measured pulse width 128, so the second threshold comparator output signal 140 remains high. Since the first threshold comparator output signal 136 and the second threshold comparator output signal 140 are different, the XNOR gate signal 150 goes low at clock cycle 19.

It should be noted that, in the example embodiments disclosed in accordance with the pulse width discriminator circuit 100 illustrated in FIG. 1, the values in the first register 108 and the second register 120 are stored at the rising edge of the clock signal 114. Therefore, an incremented first register value 110 is only loaded into the first register 108 during the current clock cycle and, thus, is not stored in the first register 108 until the rising edge of the next clock cycle. Similarly, the value stored in the first register 108 and output on the data bus 116 is only loaded in the second register 120 during the current clock cycle, and is not stored until the next clock cycle in which the enable bit of the second register 120 is set, as discussed above. Although the present embodiment illustrates a pulse width discriminator circuit 100 synchronized with the rising edge of the clock signal 114, the present disclosure is not limited to this, or other, user-defined preferences provided herein. Therefore, various changes and alternate implementations of the present disclosure may be made without departing from the scope of the disclosure as set forth in the claims below. For example, the value loaded in the first register 108 during a clock cycle may be stored in the first register 108 at the end of the current clock cycle.

In order to illustrate operation of the pulse width discriminator circuit 100 for different input parameters, the waveforms 400 illustrated in FIGS. 4A, 4B, and 4C are identical except for the threshold input signal 146, the window input signal 152, and the output signal 104. As such, the waveforms illustrated in FIGS. 4A, 4B, and 4C show how the output signal 104 changes when the different parameters are provided to the pulse width discriminator circuit 100. In the example embodiment illustrated in FIG. 4A, the window input signal 152 is logic high. Therefore, the XNOR gate signal 150 is selected by the window multiplexer 148 as the output signal 104 of the pulse width discriminator circuit 100. As such, the output signal 104 of the embodiment illustrated in FIG. 4A indicates whether or not the measured pulse width falls within a range defined by the first and second threshold values.

In the example embodiment illustrated in FIG. 4B, the window input signal 152 is logic low. Therefore, the output signal 104 is determined based upon the comparator output signal selected by the threshold multiplexer 144. Since the threshold input signal 146 is low, the second threshold comparator output signal 140 is selected as the output signal 104 of the pulse width discriminator circuit 100. Therefore, the output signal 104 of the embodiment illustrated in FIG. 4B indicates whether or not the measured pulse width is greater than the second threshold value 138.

Finally, in the example embodiment illustrated in FIG. 4C, the window input signal 152 is also low, and thus, the output signal 104 is determined based upon the value of the threshold input signal 146. Since the threshold input signal 146 is high, the first threshold comparator output signal 136 is selected as the output signal 104 of the pulse width discriminator circuit 100. Therefore, the output signal 104 of the embodiment illustrated in FIG. 4C indicates whether or not the measured pulse width is less than the first threshold value 134.

Figure 5:
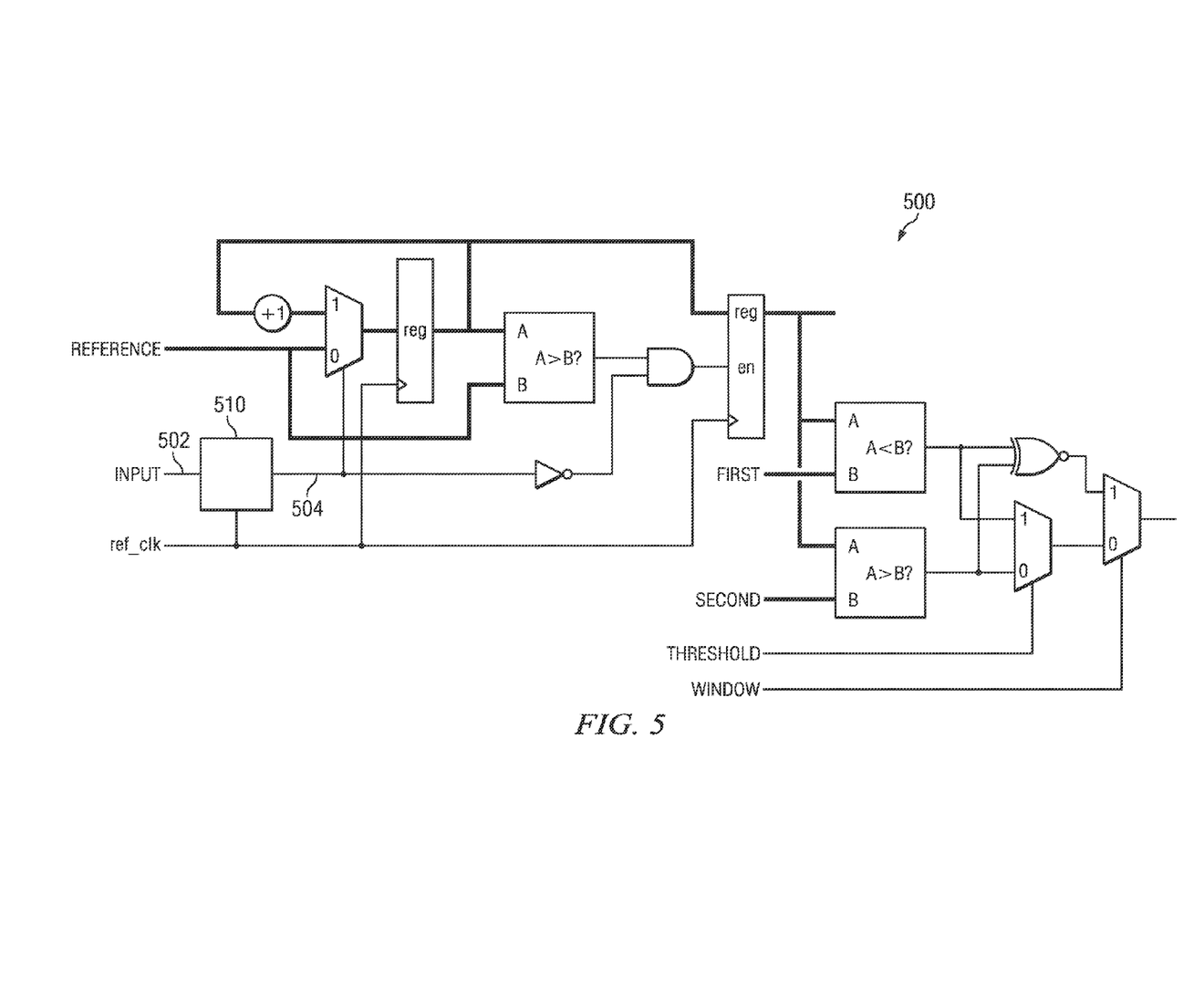
FIG. 5 illustrates a circuit diagram representing an additional embodiment of the disclosed pulse width discriminator circuit having a deglitcher coupled to its input.

In other embodiments, such as that illustrated in FIG. 5, the disclosed pulse width discriminator circuit 500 may include deglitcher circuitry 510 for filtering the input signal 502, thus providing a glitch-free input signal 504 to the first section of the pulse width discriminator circuit. In this embodiment, the deglitcher circuitry 510 may be any deglitcher circuit designed to receive an input signal 502 and produce an output signal 504 that is a glitch-free reconstruction of the input signal 502, and may include, for example, a chain of flip-flops clocked on a fixed time interval, or any other deglitcher circuitry known in the art. In embodiments having spatial limitations, the deglitcher circuitry 510 may include a deglitcher circuit that uses a reduced amount of memory, such as the deglitcher circuit having a programmable hysteresis disclosed in U.S. patent application Ser. No. 12/980,534, entitled "Deglitcher with Programmable Hysteresis," and filed Dec. 29, 2010, the disclosure of which is incorporated herein by reference. In this embodiment, the deglitcher circuit 510 uses a register to reduce the number of memory elements required to sample an input signal 502, and produces a time-shifted, glitch-free reconstruction 504 of the input signal 502.

What is claimed is:

1. A pulse width discriminator circuit, comprising:
   a first circuit configured to receive a pulsing logic signal and count a value indicative of a number of clock cycles that said pulsing logic signal has a first logic state; and
   a second circuit configured to compare said counted value to a threshold and generate an output signal when said value satisfies said threshold.

2. The circuit of claim 1, wherein said first circuit comprises an incrementing circuit configured to increment said counted value in response to each clock cycle while said pulsing logic signal has the first logic state and reset to a reset value when said pulsing logic signal has a second logic state.

3. The circuit of claim 2, wherein said first circuit further comprises a register circuit configured to store the counted value in response to said pulsing logic signal having the second logic state.

4. The circuit of claim 1, wherein said second circuit comprises a comparator circuit configured to compare said counted value to a first threshold value and generate a first output signal when the counted value is less than the first threshold value.

5. The circuit of claim 1, wherein said second circuit comprises a comparator circuit configured to compare said counted value to a second threshold value and generate a second output signal when the counted value is greater than the second threshold value.

6. The circuit of claim 1, wherein said second circuit comprises:
   a first comparator circuit configured to compare said counted value to a first threshold value and generate a first output signal when the counted value is less than the first threshold value; and
   a second comparator circuit configured to compare said counted value to a second threshold value and generate a second output signal when the counted value is greater than the second threshold value.

7. The circuit of claim 6, wherein said second circuit further comprises a logic circuit configured to logically combine the first and second output signals to generate a third output signal when said counted value is less than the first threshold value and greater than the second threshold value.

8. The circuit of claim 7, where said second circuit further comprises a selection circuit configured to select one of said first, second or third output signals as a fourth output signal.

9. The circuit of claim 1, wherein said first circuit comprises:
   a first multiplexer operable to receive an incrementing value and load the incrementing value in a first memory when said pulsing logic signal is in the first logic state, and load the reset value in said first memory when said pulsing logic signal is in the second logic state;

a first comparator operable to compare a value stored in the first memory to said reset value; and a second memory operable to receive said value stored in the first memory value and store said value stored in the first memory as the counted value when said stored first memory value is greater than said reset value and said input signal is said second logic state.

10. The circuit of claim 9, wherein the first circuit comprises an incrementing circuit having an input receiving the value stored in the first memory and an output generating the incrementing value.

11. The circuit of claim 9, wherein the second circuit comprises:

a second comparator operable to compare said counted value to a first threshold value and output a second comparator signal; and a third comparator operable to compare said counted value to a second threshold value and output a third comparator signal.

12. The circuit of claim 11, further comprising logic circuitry operable to generate an output signal indicative of a relationship between said counted value and at least one of said first and second threshold values.

13. The circuit of claim 11, wherein at least one of said reset value, said first threshold value, and said second threshold value is a user-programmable value.

14. A method, comprising:

receiving a pulsing logic signal;

incrementing a counter value when said pulsing logic signal has a first logic state;

resetting said counter value when said pulsing logic signal has a second logic state;

comparing said counter value to a threshold; and generating an output signal when said value satisfies said threshold.

15. The method of claim 14, incrementing comprises incrementing said counter value in response to a clock signal while said pulsing logic signal has the first logic state.

16. The method of claim 15, further including storing the counter value in response to said pulsing logic signal having the second logic state.

17. The method of claim 14, wherein comparing comprises comparing said counter value to a first threshold value and generating a first output signal when the counter value is less than the first threshold value.

18. The method of claim 14, wherein comparing comprises comparing said counter value to a second threshold value and generating a second output signal when the counter value is greater than the second threshold value.

19. The method of claim 14, wherein comparing comprises:

comparing said counter value to a first threshold value and generating a first output signal when the counter value is less than the first threshold value; and comparing said counter value to a second threshold value and generate a second output signal when the counter value is greater than the second threshold value.

20. The method of claim 19, further comprising logically combining the first and second output signals to generate a third output signal when said counter value is less than the first threshold value and greater than the second threshold value.

21. The method of claim 20, further comprising selecting one of said first, second or third output signals as a fourth output signal.

* * * * *